United States Patent
Griswold et al.

(10) Patent No.: US 7,622,927 B2
(45) Date of Patent: Nov. 24, 2009

(54) MAGNETIC RESONANCE APPARATUS WITH RF AMPLIFIER(S) DISPOSED WITHIN THE SPACED DISTANCE BETWEEN THE PRIMARY AND SECONDARY GRADIENT COIL WINDINGS

(75) Inventors: Mark A. Griswold, Shaker Heights, OH (US); Jeremiah Heilmann, University Heights, OH (US); Wolfgang Renz, Erlangen (DE); Markus Vester, Nürnberg (DE)

(73) Assignees: Siemens Aktiengesellschaft, Munich (DE); Case Western University, Cleveland, OH (US)

( * ) Notice: Subject to any disclaimer, the term of this patent is extended or adjusted under 35 U.S.C. 154(b) by 0 days.

(21) Appl. No.: 12/101,252

(22) Filed: Apr. 11, 2008

(65) Prior Publication Data
US 2009/0256571 A1 Oct. 15, 2009

(51) Int. Cl.
*G01V 3/00* (2006.01)
(52) U.S. Cl. .......................... 324/318; 324/322; 324/307
(58) Field of Classification Search ......... 324/300–322; 333/219–235; 600/407–435
See application file for complete search history.

(56) References Cited

U.S. PATENT DOCUMENTS

| | | | | |
|---|---|---|---|---|
| 3,406,333 A * | 10/1968 | Nelson | ......................... | 324/320 |
| 3,564,398 A * | 2/1971 | Nelson | ......................... | 324/320 |
| 5,424,643 A * | 6/1995 | Morich et al. | ................. | 324/318 |
| 5,572,133 A * | 11/1996 | Bunk | ........................... | 324/322 |
| 6,479,999 B1 * | 11/2002 | DeMeester et al. | ........... | 324/318 |
| 6,842,005 B2 * | 1/2005 | Schuster | ....................... | 324/318 |
| 6,867,592 B2 * | 3/2005 | Gebhardt et al. | ............. | 324/318 |
| 6,888,153 B2 * | 5/2005 | Hayes | ....................... | 250/515.1 |
| 7,075,300 B2 * | 7/2006 | Kolbeck et al. | .............. | 324/318 |
| 7,145,335 B2 * | 12/2006 | Nistler et al. | ................ | 324/307 |
| 7,161,353 B2 * | 1/2007 | Schaaf et al. | ................ | 324/318 |
| 7,508,209 B2 * | 3/2009 | Dietz et al. | .................. | 324/318 |
| 7,554,326 B2 * | 6/2009 | Sakakura | ..................... | 324/318 |
| 2003/0206018 A1 * | 11/2003 | Gebhardt et al. | ............. | 324/318 |
| 2004/0113618 A1 * | 6/2004 | Schuster | ....................... | 324/318 |
| 2004/0113619 A1 * | 6/2004 | Schuster et al. | .............. | 324/318 |
| 2005/0030030 A1 * | 2/2005 | Kolbeck et al. | .............. | 324/318 |
| 2005/0062472 A1 * | 3/2005 | Bottomley | ................... | 324/317 |
| 2005/0073311 A1 * | 4/2005 | Nistler et al. | ................ | 324/318 |
| 2005/0242814 A1 * | 11/2005 | Schaaf et al. | ................ | 324/318 |
| 2006/0033497 A1 * | 2/2006 | Chmielewski et al. | ....... | 324/318 |
| 2006/0262826 A1 * | 11/2006 | Dietz et al. | .................... | 372/96 |
| 2007/0268021 A1 * | 11/2007 | Sakakura | ..................... | 324/318 |

* cited by examiner

*Primary Examiner*—Brij B. Shrivastav
*Assistant Examiner*—Tiffany A Fetzner
(74) *Attorney, Agent, or Firm*—Schiff Hardin LLP

(57) ABSTRACT

An arrangement configured for controlling an antenna arrangement in a magnetic resonance device has an antenna arrangement that surrounds an examination region and that has at least one antenna element configured for emitting an amplified transmit signal. At least one amplifier is provided, at the input of which a high-frequency transmit signal is connected, which is present on the output side of the amplifier as an amplified transmit signal. The amplifier is connected to a feed point of the antenna arrangement on the output side, in order to emit the amplified transmit signal. Coil windings of a primary gradient coil are also provided, which at least partially include the antenna arrangement and the examination region. Coil windings of a secondary gradient coil at least partially include the coil windings of the primary gradient coil, the antenna arrangement (and the examination region). The coil windings of the secondary gradient coil and the coil windings of the primary gradient coil are at a distance from one another, and within that distance the at least one amplifier is arranged.

10 Claims, 3 Drawing Sheets

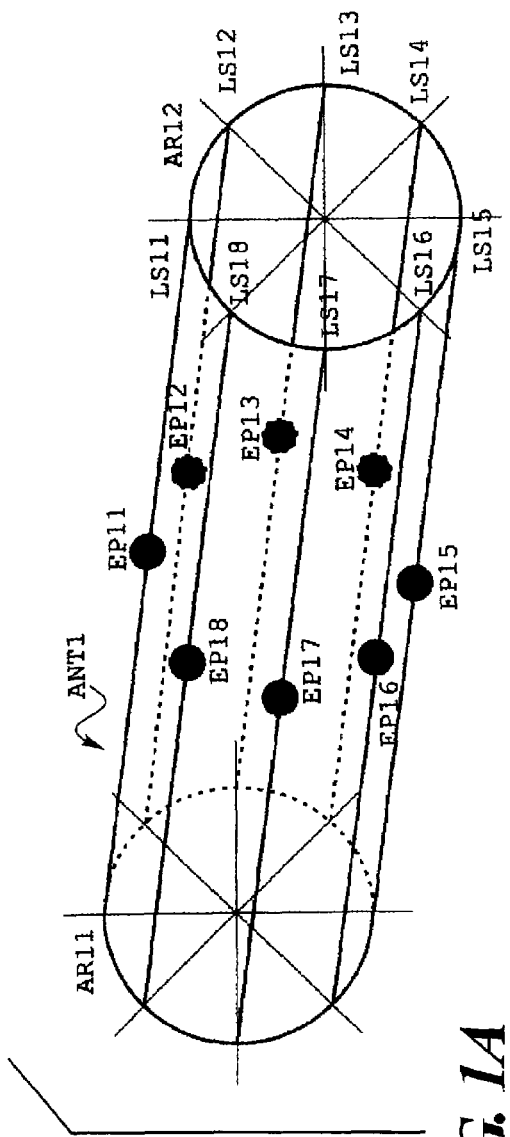
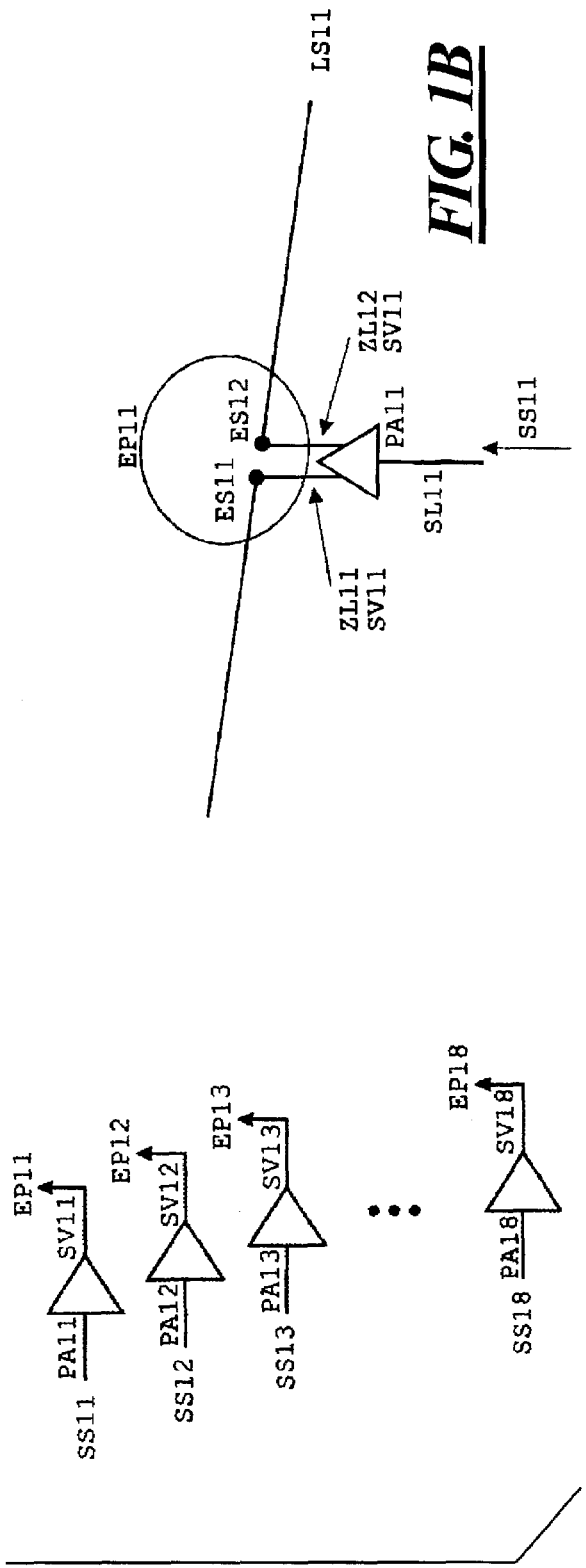
FIG. 1A
FIG. 1B

MAGNETIC RESONANCE APPARATUS WITH RF AMPLIFIER(S) DISPOSED WITHIN THE SPACED DISTANCE BETWEEN THE PRIMARY AND SECONDARY GRADIENT COIL WINDINGS

BACKGROUND OF THE INVENTION

1. Field of the Invention

The present invention relates to a magnetic resonance imaging apparatus, and more particularly to an arrangement of components for controlling an antenna arrangement in the magnetic resonance apparatus.

2. Description of the Prior Art

Magnetic resonance devices with a transmitting antenna for multi-channel measurements are becoming increasingly important. It is thereby desirable to arrange the necessary high-frequency transmission power amplifiers in direct proximity to the respective antenna connectors, but this desire is restricted by the space available on the antenna.

With a multi-channel operation of the antenna arrangement, the transmission power amplifiers, which are used in each instance in the case of an arrangement which is close to the antenna, need to be shielded, with a high degree of complexity, in order to avoid mutual influencing of the amplifier and the antenna field. This is particularly significant for the described multi-channel transmitting antenna, since the antenna elements which are adjacent hereto interact with the transmission power amplifier of an examined antenna element.

A further problem is the additional heat produced by the amplifier during the transmission operation, this heat possibly requiring extensive cooling.

With an arrangement of the amplifiers remote from an antenna, additional signal attenuations are produced by feed cables, which connect the amplifier output with assigned feed points of the antenna arrangement.

SUMMARY OF THE INVENTION

An object of the present invention is to provide an arrangement for controlling an antenna arrangement, which allows the transmission power amplifiers to be arranged near to the antenna without the need for extensive cooling.

The invention is used in a magnetic resonance apparatus having a gradient coil system of the following type.

The gradient coil system is generally surrounded by conductive structures, in which eddy currents are induced by connected gradient fields. The fields generated by the eddy currents weaken and distort the temporal course of a desired gradient field. In order to largely compensate for field distortions, actively shielded gradient coils are used. In this way, a shielding coil associated with a gradient coil has a lower number of windings for instance and is connected to the gradient coil such that the shielding coil is passed through by the same current as the gradient coil, in the opposite direction however. As a result of the connecting wiring, the shielding coil is generally referred to as a secondary gradient coil, while the field-generating gradient coil actually required for magnetic resonance imaging is referred to as a primary gradient coil.

In the arrangement of components according to the invention for controlling an antenna arrangement in a magnetic resonance apparatus, the antenna arrangement surrounds an examination region and has at least one antenna element for emitting an amplified transmit signal. An amplifier has an input, to which a high-frequency transmit signal is connected. This is present at an output of the amplifier as an amplified transmit signal. The output of the amplifier is connected to a feed point of the antenna arrangement in order to emit the amplified transmit signal. Coil windings of a primary gradient coil at least partially include the antenna arrangement and the examination region. Coil windings of a secondary gradient coil at least partially include the coil windings of the primary gradient coil, the antenna arrangement and the examination region. The coil windings of the secondary gradient coil and the coil windings of the primary gradient coil are each at a distance from one another. In accordance with the invention, the amplifier is arranged at a distance between the coil windings of the primary and the secondary gradient coil.

The actual gradient fields for a magnetic resonance examination to be carried out on a patient in the examination region are formed with the aid of the primary gradient coil, while an electrical shield of the surrounding area of a magnetic resonance device is realized with the aid of the secondary gradient coil.

The aforementioned distance used can also be at least partially used to accommodate the so-called "shim irons" there. The magnetic field required for the magnetic resonance examination is homogenized with the aid of the shim irons.

The present invention advantageously uses the fact that this available distance does not have to be completely occupied with shim irons.

An amplifier arrangement which is close to the antenna is possible with the aid of the inventive arrangement, so that only short supply lines are needed between the amplifier output and the antenna element. Line losses and signal attenuations along the supply lines are thus avoided.

A cooling of the primary and/or secondary gradient coil, which is present where applicable, is also advantageously used to dissipate the heat formed by the amplifier. An additional cooling apparatus for the power amplifier is thus advantageously avoided and the hardware outlay reduced.

BRIEF DESCRIPTION OF THE DRAWINGS

FIGS. 1A and 1B show an example of components for control of an antenna arrangement, of the type in which the invention is used.

DESCRIPTION OF THE PREFERRED EMBODIMENTS

FIG. 1A shows an example of components for control of an antenna arrangement ANT1, in which the invention is used.

The antenna arrangement ANT1 is embodied here as a cylindrical birdcage antenna and is used with a magnetic resonance examination for recording an image of a patient.

The antenna arrangement ANT1 has eight longitudinal rods LS11 to LS18. Here, both ends of the longitudinal rods LS11 to LS18 are connected to one another by way of a circular closing ring AR11 and AR12 in each instance. If applicable, this examined closing ring has capacitors in the peripheral direction.

The antenna arrangement ANT1 is configured for a multi-channel system, so that the illustrated longitudinal rods LS11 to LS18 each have an assigned feed point EP11 to EP18. An amplified transmit signal SV11 to SV18 is connected to each of the feed points EP11 to EP18 for emission purposes, with the transmit signals SV11 to SV18 differing from one another.

In an alternative (not shown), the supply is not carried out via longitudinal rods, but instead at the closing ring.

The amplified transmit signals SV11 to SV18 are formed from connected high-frequency transmit signals SS11 to SS18 with the aid of high-frequency transmission power amplifiers PA11 to PA18. Each individual amplifier PA11 to PA18 is individually assigned in each instance to one of the feed points EP11 to EP18 so that each of the amplified transmit signals SV11 to SV18 reaches an assigned feed point EP11 to EP18 in each instance.

FIG. 1B is only representative of a supply situation at one first feed point PA 11 of a first longitudinal rod LS11. The supply situation is configured in accordance with the feed points EP12 to EP18.

The first longitudinal rod LS11 is used as an antenna element and has the first feed point EP11 with two terminals ES11 and ES12. A first amplified transmit signal SV11 is connected to the two terminals ES11 and ES12 for emission purposes.

The amplified transmit signal SV11 is formed by the amplifier PA11, the input of which a high-frequency transmit signal SS11 reaches by way of a signal line as SL11.

The amplifier PA1 is connected on the output side to the two terminals ES11 and ES12 of the feed point EP11 by way of two supply lines ZL11 and ZL12.

The type of antenna excitation shown here is referred to as an "individual rod excitation".

Figure 2:
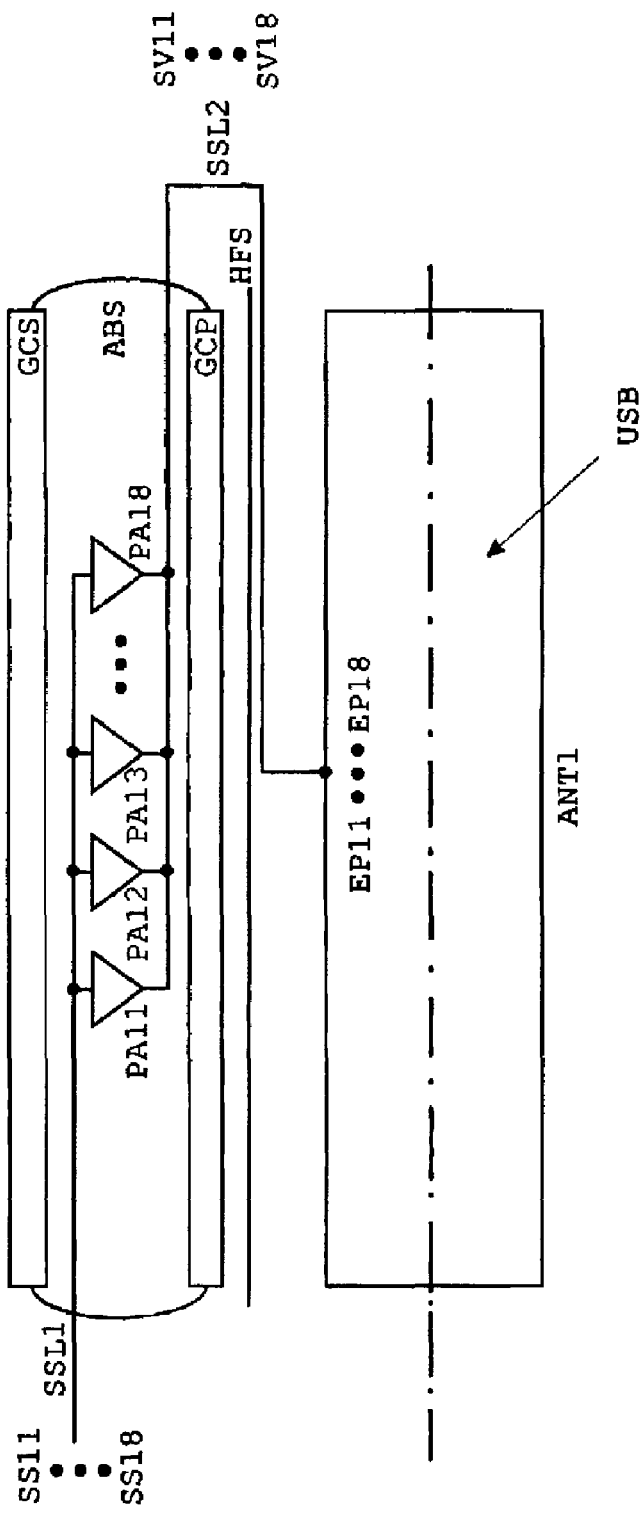
FIG. 2 shows a first embodiment of the invention.

FIG. 2 shows a first embodiment of the invention with reference to FIGS. 1A and 1B.

The antenna arrangement ANT referred to as a transmitting coil surrounds an examination region USB, which is configured to record an image of a patient.

As described, the antenna arrangement ANT1 has feed points EP11 to EP18, which the amplified transmit signals SV11 to SV18 reach in the case of a multi-channel system for emission purposes.

The amplified transmit signals SV11 to SV18 are formed from the high-frequency transmit signals SS11 to SS18 with the aid of amplifiers PA11 to PA18. The high-frequency transmit signals SS11 to SS18 are individually connected to an amplifier PA11 to PA18 assigned in each instance on the input side. The individual feed cables required for this purpose are combined to form a common first transmit line bundle SSL1.

The amplified transmit signals SV11 to SV18 reach the assigned feed points EP11 to EP18 from the respective outputs of the amplifiers PA11 to PA18. The individual feed cables required for this are combined to form a common second transmit line bundle SSL2.

A schematic representation shows coil windings of a primary gradient coil GCP, which at least partially include the antenna arrangement ANT1 and the examination region USB.

Accordingly, coil windings of a secondary gradient coil GCS at least partially include the coil windings of the primary gradient coil GCP, the antenna arrangement ANT1 and the examination region USB.

The coil windings of the second gradient coil GCS and the coil windings of the primary gradient coil GCP are at a distance ABS from one another, in which the amplifiers PA11 to PA18 are arranged in accordance with the invention.

A high-frequency shield HFS is arranged between the antenna arrangement ANT1 and the primary gradient coil GCP.

With this embodiment, the second transmit line bundle SSL2 is lead through from the distance ABS between the primary gradient coil GCP and the secondary gradient coil GCS and is lead around the high-frequency shield HFS to the feed points EP11 to EP18 of the antenna arrangement ANT1.

Figure 3:
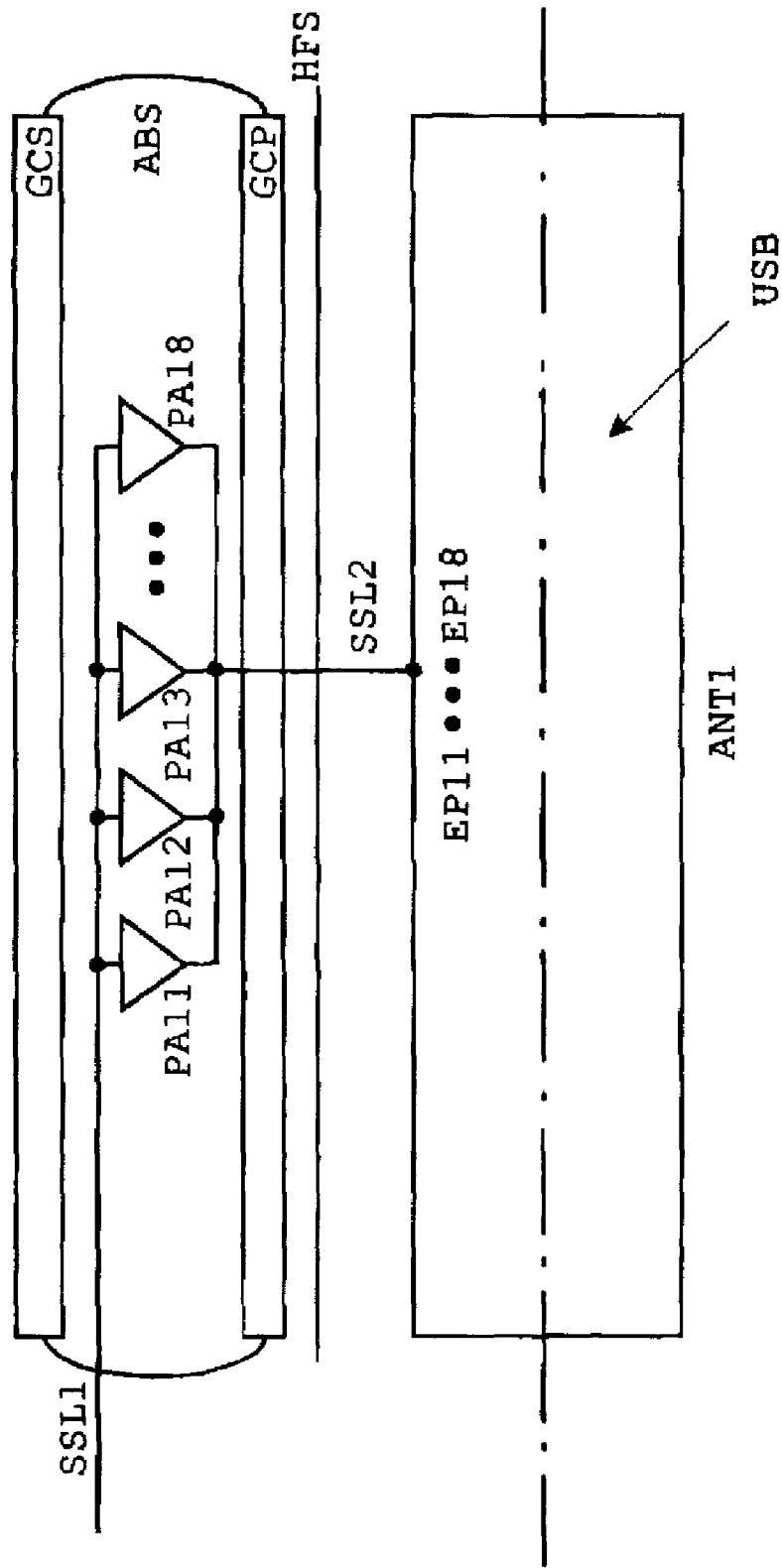
FIG. 3 shows a second embodiment of the invention.

FIG. 3 shows a second embodiment of the invention with reference to FIG. 1 and FIG. 2.

With this embodiment, the second transmit line bundle SSL2 is routed from the distance ABS between the primary gradient coil GCP and the secondary gradient coil GCS directly through the high-frequency shield HFS to the feed points EP11 to EP18 of the antenna arrangement ANT1.

The amplifiers PA11 to PA18 are shielded against high-frequency fields of the antenna arrangement ANT1 by means of the high-frequency shield HFS. An additional HF-shield of the power amplifier is thus advantageously avoided and the hardware outlay thus reduced.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
   a magnetic resonance scanner having an examination region therein configured to accommodate an examination subject in order to obtain magnetic resonance data from the subject;
   said magnetic resonance scanner comprising an antenna arrangement that surrounds the examination region, said antenna arrangement comprising at least one antenna element that emits a radio-frequency signal into the examination region; said magnetic resonance scanner comprising a primary gradient coil having primary gradient coil windings that at least partially encompass the antenna arrangement and the examination region;
   said magnetic resonance scanner comprising a secondary gradient coil having a secondary gradient coil windings that at least partially encompass the primary gradient coil windings, the antenna arrangement and the examination region, the secondary gradient coil windings and the primary gradient coil windings being spaced at a distance from each other;
   at least one amplifier having an amplifier input supplied with a radio-frequency input signal that amplifies said input signal in order to produce a radio-frequency output signal at an amplifier output of the amplifier;
   said antenna arrangement having a feed point connected to said amplifier output, at which said amplified radio-frequency signal is supplied to the antenna arrangement and emitted from said antenna arrangement into the examination region; and
   said at least one amplifier being disposed in said magnetic resonance scanner within said distance between said primary gradient coil windings and said secondary gradient coil windings.

2. A magnetic resonance apparatus as claimed in claim 1 wherein said magnetic resonance scanner comprises a high frequency shield located between said antenna arrangement and said primary gradient coil.

3. A magnetic resonance apparatus as claimed in claim 1 wherein said antenna arrangement has a conductor configuration selected from the group consisting of cylindrical conductor configurations, truncated cone-shaped conductor configurations, and birdcage antenna conductor configurations.

4. A magnetic resonance apparatus as claimed in claim 1 wherein said antenna arrangement comprises conductors formed as longitudinal rods proceeding longitudinally with respect to said examination region.

5. A magnetic resonance apparatus as claimed in claim 4 wherein said antenna arrangement comprises two annular rings respectively located at opposite ends of said longitudinal rods, electrically connecting said longitudinal rods.

6. A magnetic resonance apparatus as claimed in claim 5 wherein at least some of said longitudinal rods or annular rings have designated feed points associated therewith, and wherein said apparatus comprises a plurality of amplifiers respectively connected to said feed points, forming a multi-channel antenna system.

7. A magnetic resonance apparatus as claimed in claim 6 comprising respective feed cables supplied to the plurality of amplifiers, said feed cables being combined in order to form a common transmit line bundle.

8. A magnetic resonance apparatus as claimed in claim 7 comprising a plurality of individual feed cables respectively connecting said amplifiers with said feed points, said plurality of individual cables being combined in order to form a further common transmit line bundle.

9. A magnetic resonance apparatus as claimed in claim 7 wherein all amplifiers in said plurality of amplifiers are located within said distance between said primary gradient coil windings and said secondary gradient coil windings.

10. A magnetic resonance apparatus as claimed in claim 8 comprising a radio-frequency shield located between the antenna arrangement and the primary gradient coil, and wherein said further common transmit line bundle is fed directly through said radio-frequency shield.

* * * * *